United States Patent [19]

Cordes, III et al.

[11] Patent Number: 4,617,252
[45] Date of Patent: Oct. 14, 1986

[54] ANTIREFLECTIVE COATINGS FOR USE IN THE MANUFACTURE OF SEMI-CONDUCTOR DEVICES, METHODS AND SOLUTIONS FOR MAKING SUCH COATINGS, AND THE METHOD FOR USING SUCH COATINGS TO ABSORB LIGHT IN ULTRAVIOLET PHOTOLITHOGRAPHY PROCESSES

[75] Inventors: William F. Cordes, III, East Greenwich; Alfred T. Jeffries, III, Providence, both of R.I.

[73] Assignee: Philip A. Hunt Chemical Corporation, Palisades Park, N.J.

[21] Appl. No.: 619,737

[22] Filed: Jun. 12, 1984

Related U.S. Application Data

[63] Continuation-in-part of Ser. No. 510,212, Jul. 1, 1983, abandoned.

[51] Int. Cl.$^4$ ............................ G03C 1/84; G03F 7/26
[52] U.S. Cl. ................................. 430/272; 430/318; 524/592
[58] Field of Search .................. 430/272, 327, 318

[56] References Cited

FOREIGN PATENT DOCUMENTS 56-8825  1/1981  Japan .

OTHER PUBLICATIONS

Brewer et al., "The Reduction of the Standing-Wave Effect in Positive Photoresists", *Journal of Applied Photographic Engineering*, vol. 7, No. 6, at pp. 184–186 (Dec. 1981).

Lin et al., "Use of Antireflective Coating in Bilayer Resist Process", *J. Vac. Sci. Technol. B* 1(4), at pp. 1215–1218 (Oct.-Dec. 1983).

Arden et al., "Contrast Improvement by Antireflection Coatings for Mask and Wafer in 10:1 Projection Optics", (date and source unknown).

Reichmanis et al., "Materials for Multilevel Resist Schemes", *Polymer Engineering and Science*, vol. 23, No. 18 at pp. 1039–1042 (Dec. 1983).

Johnson, "Multilayer Resist Processes & Alternatives", *Semiconductor International*, at pp. 83–88 (Mar. 1984).

Wrasidlo and Augl, "Phenylated Polyquinoxalines from Bis(phenylglyoxaloyl)benzene", Journal of Polymer Science: Part A-1, vol. 7 at pp. 3393–3405 (1969).

*Primary Examiner*—C. Warren Ivy
*Attorney, Agent, or Firm*—Richard M. Barnes

[57]        ABSTRACT

Disclosed are antireflective layers for use in the manufacture of semi-conductor devices, methods and solutions for making such antireflective layers, and the use of such antireflective layers to absorb light in ultraviolet photolithography. The antireflective layers that are utilized comprise a polyphenylquinoxaline.

11 Claims, No Drawings

ANTIREFLECTIVE COATINGS FOR USE IN THE MANUFACTURE OF SEMI-CONDUCTOR DEVICES, METHODS AND SOLUTIONS FOR MAKING SUCH COATINGS, AND THE METHOD FOR USING SUCH COATINGS TO ABSORB LIGHT IN ULTRAVIOLET PHOTOLITHOGRAPHY PROCESSES

This application is a continuation-in-part of application Ser. No. 510,212, filed July 1, 1983, now abandoned.

FIELD OF THE INVENTION

The present invention relates to antireflective coatings for use in the manufacture of semi-conductor devices, methods and solutions for making such coatings, and the use of such coatings to absorb light in ultraviolet photolithography. The anti-reflective coatings that are utilized in the present invention comprise a polyphenylquinoxaline.

BACKGROUND OF THE INVENTION

Semi-conductor integrated circuit devices typically comprise a number of components, including: (a) a silicon wafer that includes at least one semi-conductor element (e.g., a transistor) and, on one of its surfaces, a thin layer of a non-conductor, typically silicon dioxide; (b) a number of interconnection conductor layers that are made from a conductor metal, such as aluminum, tungsten or titanium; and (c) a number of passivating layers that are made from a non-conducting material, such as silicon dioxide.

The microelectronic circuit of such semi-conductor devices comprises the semi-conductor element of the silicon wafer and the interconnection conductor layers. During manufacture, those interconnection layers are built up, layer by layer, on the silicon wafer, with each layer having a pattern prescribed by the circuit design.

Also during manufacture, passivating layers are provided between adjacent interconnection conductor layers. The interconnection conductor layers are connected to each other and to the semi-conductor element through holes in the passivating layers and the thin layer of non-conductor on the surface of the silicon wafer. Such holes are provided in the passivating layers and the thin layer of non-conductor on the surface of the silicon wafer in a predetermined pattern prescribed by the circuit design.

The fabrication of a semi-conductor device requires a method for accurately forming the patterned layers that comprise the device. The photoengraving method by which this is accomplished is known as photolithography.

Materials known as "photoresists" are used in photolithography. Photoresists that are conventionally used in connection with the manufacture of semi-conductor devices are materials whose solubility characteristics in certain solvents, which are called "developers", are affected by exposure to ultraviolet radiation. A "negative photoresist" is a material that prior to exposure to ultraviolet radiation is soluble in developer, but after exposure is insoluble in developer. In contrast, before exposure a "positive photoresist" is insoluble in developer, but after exposure to ultraviolet light it becomes soluble in developer.

Photoresists are used in connection with the forming of the pattern of each of the various layers in a semiconductor device. For example, a negative photoresist may be used to pattern the silicon dioxide layer of an oxidized silicon wafer by the process described below.

Firt, the negative photoresist is applied to the oxidized surface of the silicon wafer by: (a) dissolving the photoresist in a suitable solvent; (b) applying a drop or several drops of the resulting photoresist solution onto the oxidized surface of the wafer; (c) rapidly spinning the wafer to spread a thin film of the solution across the oxidized surface of the wafer; and (d) evaporating the solvent from the solution to leave a thin film of the negative photoresist on the oxidized surface of the silicon wafer. Typically, the photoresist is then heat treated to dry it out thoroughly and to improve its adhesion to the silicon wafer.

The negative photoresist layer is next selectively exposed to ultraviolet radiation. This may be accomplished by positioning a patterned mask into juxtaposition with the negative photoresist layer and then flooding the mask with ultraviolet light. As previously mentioned, the solubility characteristics of the negative photoresist are altered by the exposure, i.e., after exposure, the exposed portion of the photoresist is insoluble in a developer solution while the non-exposed portion remains soluble in the developer solution.

After exposure, the negative photoresist is developed (i.e., it is washed in a developer solution) to remove the portion of the photoresist layer that was not exposed to ultraviolet radiation. The photoresist pattern that remains after development may then be hardened further by heat treatment.

The wafer, with its photoresist pattern on it, is then placed in a solution (e.g., a hydrofluoric acid solution) that dissolves or etches the silicon dioxide layer wherever it is not protected by the photoresist, but does not attack to any significant extent the photoresist itself, the portion of the silicon dioxide layer under the photoresist, or the portion of the silicon wafer under its silicon dioxide layer. The wafer is then rinsed and dried and the remaining photoresist pattern is removed by further chemical treatment, leaving a silicon wafer with a silicon dioxide layer in a prescribed pattern on one of its surfaces.

Other layers of the semi-conductor device may be patterned by procedures similar to that described above. For example, aluminum interconnection conductor layers may be patterned by using a warm phosphoric acid solution to dissolve or etch the portion of the aluminum layer that is not protected by the photoresist after selective exposure and development of the photoresist.

Substantial efforts have been devoted over the years to reducing semi-conductor integrated circuit devices to the smallest possible size. These efforts have been successful to a large extent due to a number of advances in the art including, inter alia, the miniaturization of circuit elements and their interconnections.

One consequence of the successful efforts to reduce the size of semi-conductor devices has been an ever increasing need to pattern each layer of the multi-layered structure precisely in accordance with the specifications for that layer and to position each pattern accurately with respect to the patterns in the other layers of the semi-conductor device. Any substantial deviation from the specifications for the semi-conductor device in these regards can result in a device that does not function in the proper way.

An operation in the manufacture of semi-conductor devices that must be precisely controlled to achieve a defect free device is the selective exposure of the various photoresist layers utilized in the construction of the device. In particular, it is important that the photoresist be exposed in those areas dictated by the specifications for the device, and only in those areas.

A phenomenon that has inhibited the precise exposure of photoresist layers to ultraviolet light is the internal reflections that occur in a semi-conductor device as a consequence of the exposure. Such reflections occur when ultraviolet light that has passed through a photoresist layer is reflected back from a reflective surface in the semi-conductor device. Such a reflective surface may be a silicon dioxide layer on the silicon wafer itself, a metal (e.g., aluminum) interconnection conductor layer, or a reflective passivating layer (e.g., a silicon dioxide passivating layer).

Typically, ultraviolet light is scattered when it is reflected as described in the preceding paragraph. As a consequence, portions of the photoresist are exposed by the reflected light that were not exposed when the ultraviolet light initially passed through the photoresist. This, of course, may result in a photoresist pattern after development that does not correspond to the pattern prescribed by the mask through which the photoresist was exposed.

A number of techniques have been proposed to eliminate or minimize reflections of the type described above. For example, one technique that has been proposed has been to apply a thin coating of a polyimide, which includes a dye, on a silicon wafer before a positive photoresist is applied to the wafer (see Brewer et al., "The Reduction of the Standing-Wave Effect in Positive Photoresists", *Journal of Applied Photographic Engineering*, Vol. 7, No. 6, at pp. 184–86 (December 1981)). In this technique, the dye is said to absorb the light that passes through the photoresist during exposure and the polyimide is said to provide a smooth coating that can be etched with a standard photoresist developer without extra processing steps.

SUMMARY OF THE INVENTION

The present invention relates to the use of polyphenylquinoxalines as antireflective layers in semi-conductor devices. More particularly, the present invention is directed to a semi-conductor device comprising a polyphenylquinoxaline antireflective layer, the use of the polyphenylquinoxaline antireflective layer to absorb ultraviolet radiation during photolithographic processes, a method of applying the antireflective layer to the semi-conductor device and a polyphenylquinoxaline-containing solution for use in that method.

As used herein, the terms "ultraviolet radiation" and "ultraviolet light" shall include radiation having a wavelength somewhat longer than radiation in the near ultraviolet region as well as radiation in the near, mid and deep ultraviolet regions. In particular, ultraviolet radiation, as used herein, shall include, inter alia, light having a wavelength of from about 500 nm to about 440 nm as well as light in the near ultraviolet region (i.e., light having a wavelength in the range of from about 440 nm to about 350 nm).

The semi-conductor device of the invention comprises a silicon wafer, an antireflective layer and a photoresist layer. The silicon wafer comprises at least one semi-conductor element (e.g., a transistor or a diode) and a layer of a non-conductor at one of its surfaces. Preferably, the layer of a non-conductor comprises silicon dioxide.

As previously mentioned, the antireflective layer comprises a polyphenylquinoxaline. The antireflective layer has a thickness of less than about 1.0 micron, more preferably, has a thickness of from about 0.05 to about 1.0 micron, and most preferably has a thickness of from about 0.1 to about 0.8 micron.

The photoresists used in the present invention are materials whose solubility characteristics in certain solvents are affected by exposure to ultraviolet light having a wavelength in the range of from about 500 nm to about 350 nm. Negative photoresists as well as positive photoresists may be used in the invention.

The antireflective layer is positioned underneath the photoresist layer so that ultraviolet light that passes through the photoresist layer during the selective exposure of that layer passes into the antireflective layer. We believe that our antireflective layers absorb substantial quantities of ultraviolet light having a wavelength of from about 500 nm to about 350 nm, particularly light having a wavelength of about 436 nm, that is passed into it. As a consequence, exposure to the photoresist by light reflected back from reflective layers in the semi-conductor device is substantially reduced, or eliminated in its entirety, by our use of a polyphenylquinoxaline antireflective layer.

The polyphenylquinoxaline containing antireflective layers may be used to minimize reflections from a number of different layers in semi-conductor devices. For example, the antireflective layer may be applied on top of a layer of a non-conductor (e.g., silicon dioxide) that has been applied to one of the surfaces of the silicon wafer to minimize reflections from the silicon wafer during the selective exposure of a photoresist layer that is coated on top of the antireflective layer. Similarly, the antireflective layer may be applied on top of interconnection conductor layers (e.g., interconnection conductor layers made from aluminum, tungsten or titanium) or on top of passivating layers (e.g., passivating layers made from silicon dioxide) to reduce, or eliminate altogether, reflections from those layers.

It will be appreciated that the antireflective layers of the present invention will not only absorb ultraviolet light having a wavelength from about 500 nm to about 350 nm that passes into it from the photoresist layer, but also will absorb such ultraviolet light that is reflected back from a reflective layer in the semi-conductor device. Thus, ultraviolet light that passes through the photoresist layer must pass through the antireflective layer twice without being absorbed therein in order to expose the photoresist a second time.

The polyphenylquinoxaline-containing antireflective layers of the present invention preferably are made from coating solutions that comprise a polyphenylquinoxaline polymer in a solvent selected from the group consisting of chloroform, sym-tetrachloroethane, m-cresol, phenol, anisole, o-methoxyphenol, toluene, xylene, super highflash naphtha, and mixtures thereof. Such solutions have a solids content (i.e., a polyphenylquinoxaline content) of from about 3% to about 11% by weight, preferably from about 4% to about 9% by weight, a viscosity at 25° C. of from about 10 to about 250 cps, preferably from about 25 to about 125 cps. Most preferably, the solutions have a sodium ion content of less than about 1 ppm by weight.

Super highflash naphtha referred to in the preceding paragraph is an art recognized product having a high flash point and comprising a mixture of alkylated aromatic hydrocarbons. The mixture has a boiling point in the range of from about 318° F. to about 350° F.

The antireflective layers of the present invention are preferably formed by applying to a surface of a semi-conductor device from about 1 to about 10 ml of the polyphenylquinoxaline-containing solution described above per 3 square inches of the surface and then spinning the semi-conductor device at from about 1000 to about 7000 rpm for up to about 1 minute to distribute the solution across the surface of the device. The solvent is then removed from the solution, preferably by drying, to obtain a polyphenylquinoxaline layer having a thickness of less than about 1.0 micron, more preferably a thickness of from about 0.05 to about 1.0 micron, and most preferably from about 0.1 to about 0.8 micron.

The preferred polyphenylquinoxaline-containing antireflective layers of the present invention are characterized by a sodium ion content of less than about 3 ppm, a glass transition temperature (Tg) of at least about 280° C., and an electrical resistance of from about $10^{14}$ to about $10^{17}$ ohm-cm.

The polyphenylquinoxaline-containing antireflective layers of the present invention are characterized by a number of desirable properties in addition to their ability to absorb ultraviolet light. For example, the optical properties of the layers (i.e., their ability to absorb ultraviolet light) are relatively stable under heat treatment of up to at least about 150° C. for sixty minutes. In addition, the antireflective layers are physically stable under such heat treatment. These properties are desirable because, as previously noted, the photoresist layers utilized during the processing of semi-conductor devices typically are heat treated during that processing.

As another example, visible light is transmitted through the polyphenylquinoxaline containing antireflective layers of the present invention. This characteristic of the antireflective layers is desirable because it permits the person responsible for the manufacture of a semi-conductor device to align visually the mask through which a transparent photoresist layer is exposed with a layer underlying the antireflective layer (e.g., an etched interconnection conductor layer).

DESCRIPTION OF THE PREFERRED EMBODIMENTS

Preferably, the polyphenylquinoxaline polymer utilized in the antireflective layers of the present invention is the reaction product of (A) an aromatic tetraamine compound selected from the group consisting of

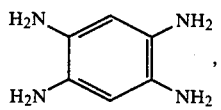

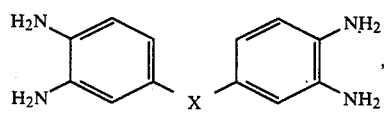

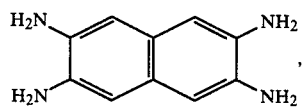

-continued

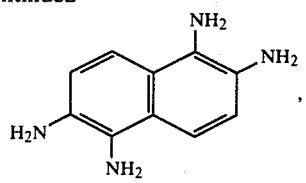

and mixtures thereof; and (B) a tetracarbonyl compound selected from the group consisting of

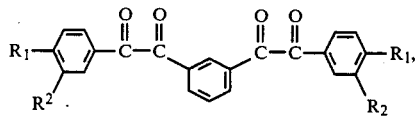

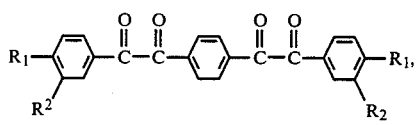

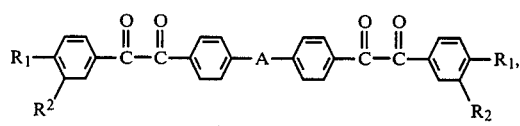

and mixtures thereof; wherein X and A are, independently, a direct bond, O,

S, SO, SO$_2$,

or CH$_2$; and each Y and each Z are, independently, monovalent C$_1$ to C$_6$ alkyl or monovalent aryl, preferably phenyl, 1-naphthyl, 2-naphthyl, 2-furyl, 3-furyl, 2-thienyl, 3-thienyl, 2-(-1-methylpyrroyl) or 3-(1-methylpyrroyl); R$_1$ and R$_2$ are, independently, H or OH, preferably R$_1$ or R$_2$ is OH and, more preferably, R$_1$ is OH and R$_2$ is H.

Preferably, the polyphenylquinoxaline also has the following characteristics: (a) it has a glass transition temperature of at least about 280° C., more preferably between about 280° and about 310° C., and (b) when 0.5 g of the polymer is mixed with 100 ml of 98% by weight sulfuric acid, the resulting solution has an inherent viscosity at 30° C. of from about 0.5 to about 2.5 dl/g.

Preferred polyphenylquinoxalines are the reacton products of

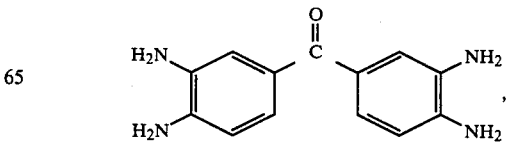

$R_1=R_2=H$, and which is believed to consist of units of the formula

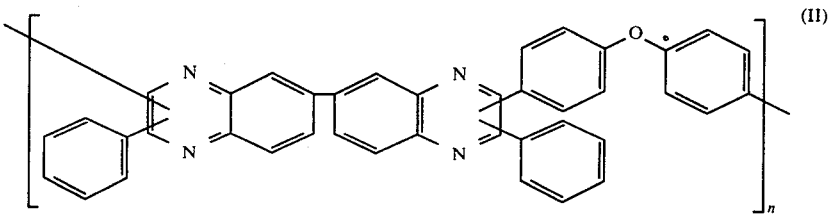

Particularly preferred is a polyphenylquinoxaline consisting of units of formula II ($R_1=R_2=H$) which is further characterized by a number average molecular weight ($\overline{Mn}$) of from about 23,000 to about 38,000 g/mole, a glass transition temperature of about 290° C., and an inherent viscosity of about 0.8 dl/g at 25° C. when it is mixed as a 0.5% by weight solution in m-cresol.

Polyphenylquinoxalines of the type described above are readily prepared according to methods known to those skilled in the art as evidenced by P. M. Hergenrother, "Linear Polyquinoxalines", *J. Macromol. Sci.-Revs. Macromol. Chem.*, C6(1), 1–28 (1971).

The polyphenylquinoxaline-containing solutions of the invention are prepared by dissolving the polymer in a solvent selected from the group consisting of chloroform, sym-tetrachloroethane, m-cresol, phenol, anisole, o-methoxyphenol, toluene, xylene, super highflash naphtha and mixtures thereof. Preferably, the solvent is m-cresol, a mixture of xylene and m-cresol, or a mixture of m-cresol and super highflash naphtha. Preferably the mixtures that contain two solvents comprise about equal parts of the two solvents. Particularly preferred is a mixture comprising 56% by weight super highflash naphtha and 44% by weight m-cresol. When the foregoing mixtures of two solvents are used, the solutions are preferably maintained until use in opaque fluorocarbon resin containers to prevent the xylene or super highflash naphtha from diffusing through the wall of the container, resulting in a change in solution viscosity.

Other materials may be utilized as part of the solvent system in combination with the solvents listed in the preceding paragraph. For example, dimethylsulfoxide, N,N-dimethylacetamide, and/or 1-methyl-2-pyrrolidinone may be mixed with polyphenylquinoxaline and one or more of the solvents described in the preceding paragraph to obtain a polyphenylquinoxaline containing solution of the invention.

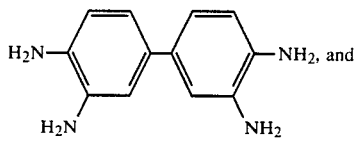

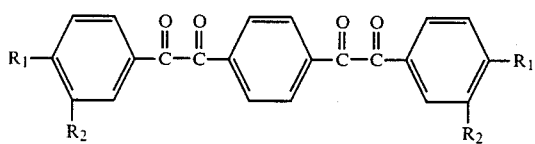

wherein $R_1$ and $R_2$ have the previously assigned meanings, preferably $R_1=R_2=H$, more preferably $R_1=OH$, $R_2=H$, and which is believed to consist of units of the formula:

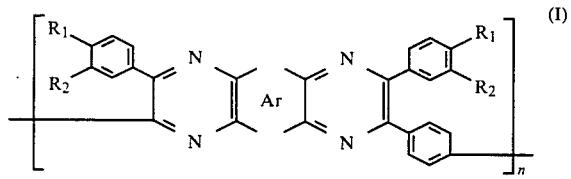

in which Ar represents

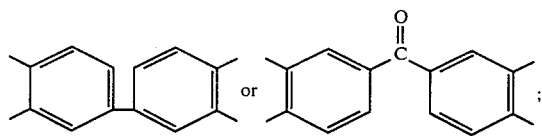

although the exact structure is not known since it is a random polymer.

Another group of preferred polyphenylquinoxalines are the reaction products of

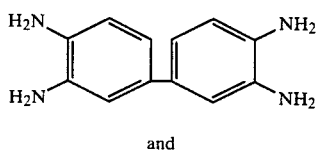

and

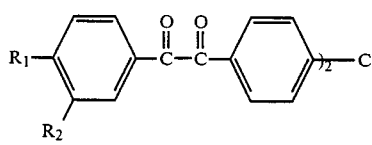

wherein $R_1$ and $R_2$ have the previously assigned meanings, preferably $R_1=OH$, $R_2=H$, more preferably The polyphenylquinoxaline is present in the solution in an amount to provide a solids content (i.e., a polyphenylquinoxaline content) of from about 3 to about 11% by weight, preferably from about 4 to about 9% by weight. At solids contents of less than about 3% by weight or greater than about 11% by weight, difficulties will be encountered in the formation of films of the desired thicknesses and properties.

The percentage solids in the solutions of the present invention may be determined by weighing the constituents that are used to make the solutions and then calculating the percent of the polyphenylquinoxaline in the resulting solution. This procedure may be used, for example, when the purity of the polyphenylquinoxaline used to make the solution is known.

Alternatively, the percentage solids in the solutions may be determined by pouring ten grams of the solution into 100 ml of rapidly chopping reagent grade methanol held in a blender cup. The cup is then closed and the mixture chopped for one minute at full speed. The resulting suspension is filtered using a sintered glass funnel and is then washed with 100 ml of boiling reagent grade methanol. The solid on the filter is transferred to a 250 ml Erlenmeyer flask and is boiled for five minutes with constant agitation. The resulting suspension is filtered and then washed with 100 ml of boiling reagent grade methanol resulting in a solid on the filter which is transferred to a suitable container such as a glass Petri dish and dried to a constant weight of about ±5 mg at about 325° to 350° C. under a flow of nitrogen. The percentage solids is equal to 100 times the quotient of the weight of the dried solid divided by 10 grams (the weight of the solution precipitated).

The solution of the present invention has a viscosity of from about 10 to about 250 cps, preferably from about 25 to about 125 cps, as measured at 25° C., using a Brookfield Synchro-Lectric Viscometer, Model LVT (manufactured by Brookfield Engineering Laboratories, Stoughton, Mass.) equipped with an LV-18 spindle and operated at a spindle speed of 1.5 to 6 rpm. The viscosity is important to the formation of films of the desired thickness by the method of the invention. At viscosities below about 10 cps, the solution will not be sufficiently retained on the surface while at viscosities greater than about 250 cps too much solution will be retained on the surface. The viscosities of the present solutions remain substantially the same even when the solutions are stored at about 25° C. for prolonged periods of time.

The solutions have a maximum particle size of about 0.2 micron, that is, the solutions are free of particulate matter (e.g., dust) having a particle size in excess of about 0.2 micron. Because the films formed from the solutions are less than about 1 micron thick, particle sizes in excess of 0.2 micron can lead to the formation of pinholes or other such irregularities in the films.

The mobile ion content of the solutions, measured as sodium ion content, preferably is less than about 1 ppm. Sodium ion contents of up to about 3 ppm or even greater can be tolerated but it is preferred that the sodium ion content be maintained below about 1 ppm, preferably within the range of from about 0.3 to about 1 ppm. The solutions preferably are prepared and stored in opaque fluorocarbon resin containers so that the solutions are not contaminated with sodium ions by contact with glassware.

The sodium ion content of the solutions is determined using a Perkin-Elmer 306 Atomic Absorption Spectrophotometer fitted with a sodium hollow cathode lamp. The sample is heated to 200° C. in a porcelain crucible in a fume hood and the residue ashed using a Meeker burner. The ashed residue is dissolved in 0.5 ml of reagent grade nitric acid and diluted to 10 ml with deionized water containing less than 0.1 ppm sodium. The sodium ion content is measured against a 1 ppm sodium standard and the sodium ion value is calculated as ten times the quotient of the ratio of the absorbance of the sample over the absorbance of the 1 ppm sodium standard divided by the sample weight in grams.

A particularly preferred solution comprises a polyphenylquinoxaline which is the reaction product of

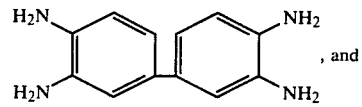, and

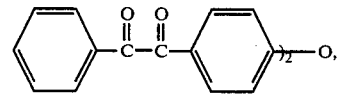

and which has an average molecular weight of from about 23,000 to 38,000 g/mole, a glass transition temperature of about 290° C., a sodium ion content of less than about 1 ppm and an inherent viscosity of about 0.8 dl/g at 25° C. when it is mixed as a 0.5% solution in m-cresol, dissolved in a solvent comprising a mixture of m-cresol and xylene or m-cresol and super highflash naphtha to yield a solution having a solids content of from about 4% to about 8% by weight and a viscosity of from about 30 to about 200 cps at 25° C.

The method for making the antireflective layers of the present invention generally comprises flooding the exposed surface of the semi-conductor device with a solution of the present invention in an amount of from about 1 to about 10 ml, preferably from about 2 to about 5 ml, per about 3 square inches of surface area, and then spinning the wafer to distribute the solution over the surface at a substantially uniform thickness. The solution is then dried to remove the solvent.

More particularly, once the solution is deposited on the surface as a static flood, the wafer is spun at from about 1000 to about 7000 rpm, preferably from about 3000 to about 6000 rpm, for up to about 1 minute, preferably from about 30 seconds to about 1 minute, so that the solution is distributed over the surface. The rate of rotation of the wafer and the total rotation time are selected in conjunction with the viscosity and solids content of the solution employed in order to form a film of the thickness desired. The method is practiced employing conventional equipment known to those skilled in the art such as a Headway Spinner, manufactured by Headway Research, Inc.

The solvent is removed to form the antireflective layer by drying the wafer, either in air or in an inert atmosphere such as nitrogen. The wafer is preferably dried at a temperature within the range of from about 100° C. to about 400° C. for up to about 3 hours, preferably from about 10 to about 90 minutes. Most preferably, the wafer is dried, in a convection oven under a stream of air or nitrogen, at a temperature of 200° C. or even higher. The reason for this is that polyphenylquinoxaline layers that have been dried at 200° C. have exhibited better antireflective properties than have layers that were dried at 150° C., possibly because solvent was not completely removed from the layers that were dried at the lower temperature.

The surface to be coated may first be treated by applying an adhesion promoter selected from the group consisting of aminosilanes and metal chelates. The adhesion promoter is preferably applied as a solution, in a manner similar to that used to apply the antireflective coating solution, by flooding a surface of the semi-conductor device with from about 1 to about 2 ml of the adhesion promoter solution and then spinning the device to distribute the solution across the surface. Preferably, the wafer is spun for a few seconds at about 500 rpm followed by spinning at from about 5000 to about 7000 rpm to set the final film thickness. The adhesion promoter is then dried, preferably in air, before applying the antireflective coating solution. If desired, the surface to be coated with the antireflective layer may be treated by other techniques to enhance the adhesion between the surface and the antireflective coating. For example, metal interconnection conductor surfaces may be subjected to a plasma pretreatment by controlled oxidation of the metal surface in order to promote adhesion of the antireflective layer. Plasma processing of the metal, which is in the zero oxidation state, etches the metal, however, and is less desirable than the previously described use of an adhesion promoter.

The thermally stable antireflective layers of the present invention are characterized by a thickness of less than about 1.0 micron, more preferably a thickness of from about 0.05 to about 1.0 micron, and most preferably from about 0.1 to about 0.8 micron, a mobile ion content, measured as sodium ion content, of preferably less than about 3 ppm by weight, and an electrical resistance of preferably from about $10^{14}$ to about $10^{17}$ ohm-cm, more preferably from about $10^{15}$ to about $10^{16}$ ohm-cm. The glass transition temperature of the polymer preferably is at least about 280° C., more preferably within the range of from about 280° to about 310° C.

The sodium ion content of the films is determined by the arc-spark method in a Jarrell-Ash 3 m plain grating Ebert mount direct current arc source spectrophotometer using high purity graphite electrodes. The sample is ashed in a quartz crucible and then dissolved in high purity nitric acid. The dissolved ash is added to bismuth oxide which is used as a flux and internal standard. High purity graphite is also added to act as a dispersant and to ensure complete combustion. This mixture is inserted in the cavity of the graphite electrode, the direct current is applied, and the sodium emission line at 5890 Å is photographed on super panchrom type B film. The intensity of the sodium line is measured using the spectrophotometer. The internal standards and sodium values are plotted against the bismuth oxide and the sodium ion values are calculated from the full curve.

The semi-conductor device on which the antireflective layer of the invention is coated comprises a silicon wafer having at least one semi-conductor element and a layer of a non-conductor on one of its surfaces. The antireflective layer of the invention may be applied on top of any reflective layer in the semi-conductor device to reduce, or eliminate altogether, reflections from that layer during the exposure to ultraviolet light of a photoresist layer on top of the antireflective layer. For example, the antireflective layer of the invention may be applied on top of a silicon dioxide layer on the silicon wafer itself, a silicon dioxide passivating layer, or an interconnection conductor layer made from a metal selected from the group consisting of aluminum, titanium and tungsten.

The photoresist that is applied on top of the antireflective layer may be a positive photoresist or a negative photoresist. The photoresists that are preferably used in the present invention are sensitive to light having a wavelength from about 500 to about 350 nm. Examples of preferred photoresists that may be used are the positive photoresists marketed by the Philip A. Hunt Chemical Corporation under the designations "HPR204" and "HPR206".

Following application of the photoresist, the photoresist may be selectively exposed to ultraviolet radiation having a wavelength of from about 500 to about 350 nm by any known technique. When a negative photoresist is utilized, before exposure the photoresist is soluble in certain solvents and, after exposure, the exposed portions of the photoresist are insoluble in those solvents. On the other hand, when a positive photoresist is utilized, before exposure the photoresist is insoluble in certain solvents and, after exposure, the exposed portions of the photoresist are soluble in those solvents.

During exposure, ultraviolet light having a wavelength of from about 500 to about 350 nm passes through the photoresist layer and into the antireflective layer. There, at least a substantial portion of the ultraviolet light is absorbed by the polyphenylquinoxaline. This absorption may occur either while the ultraviolet light is passing through the antireflective layer in a direction away from the photoresist layer or while the ultraviolet light is passing through the antireflective layer toward the photoresist after being reflected off of a reflective layer under the antireflective layer. In any event, at least a substantial portion of the ultraviolet light that passes through the photoresist layer is absorbed in the antireflective layer. As a consequence, exposure of the photoresist by reflected light is substantially diminished, if not eliminated altogether, thereby enhancing the resolution of the pattern formed in the photoresist during development.

The photoresist layer is developed by known techniques by contacting it with an appropriate developer. That developer removes either the exposed or unexposed portion of the photoresist, depending on whether a positive or a negative photoresist is being developed.

After development, the portion of the antireflective layer that is left exposed as a result of development is removed. This may be accomplished by contacting the exposed portion of the antireflective layer with oxygen plasma. Suitable oxygen plasma may be generated in a Tegal Model 702 reactor operated under the following conditions: power, 150 watts; pressure, 0.5 torr; gas flow rate, 200 cc/min.; upper and lower electrode temperatures, 25° C.

After the portion of the antireflective layer that is left exposed as a result of development is removed, the exposed portion of the layer underlying the antireflective layer may then be removed by known techniques. Thereafter, (a) the remaining portions of the photoresist and the antireflective layer may also be removed, and (b) the remaining steps necessary to complete the manufacture of the semi-conductor device may be conducted.

The following example presents illustrative, but nonlimiting, embodiments of the invention.

EXAMPLE 1

This example illustrates a method for coating polyphenylquinoxaline antireflective layers, a coating solution that is useful in such a method, and the antireflective properties of the resulting layers after they were subjected to heat treatment. The polyphenylquinoxaline that was used in this example was prepared by the method described above for preparing the polymer designated by Roman Numeral "II" in which both $R_1$ and $R_2$ are H. The polyphenylquinoxaline used in this example had an inherent viscosity at 25° C. of about 0.8 dl/g as a 0.5% by weight solution in m-cresol, a numerical average molecular weight of about 23,000 to 38,000 g/mole, and a glass transition temperature of about 290° C.

45.8 g of the polyphenylquinoxoline were dissolved in 608.4 g of a solvent comprising about 44% by weight m-cresol and 56% by weight super highflash naphtha to obtain a solution having a solids content of 7% by weight, a sodium ion content of about 1 ppm, and a solution viscosity of 35 cps at 25° C.

Polyphenylquinoxaline layers were then coated on the aluminum layers of 24 aluminum coated wafers by the following procedure:

(1) the polyphenylquinoxaline solution described above was applied to the aluminum surface of each wafer in an amount of about 2 ml of solution per 3 square inches of the surface;

(2) the wafers were then spun for about 30 seconds on a Headway Spinner at the following speeds: 2000 rpm (6 wafers), 3000 rpm (6 wafers), 4000 rpm (6 wafers), and 5000 rpm (6 wafers) to obtain four sets of six wafers, with each set of wafers having been spun at a different rate of rotation;

(3) the wafers in each set of six wafers were then baked in a convection oven, with each of the wafers in each set being baked under a different set of conditions to obtain polyphenylquinoxaline layers of varying thicknesses as shown in Table I below:

TABLE I

| Wafer Spin Speed (rpm) | Temperature (°C.) | Time (min.) | PPQ Layer Thickness (Å) |
|---|---|---|---|
| 2000 | 100 | 30 | 7793 |
| 2000 | 100 | 45 | 7887 |
| 2000 | 100 | 60 | 7661 |
| 2000 | 150 | 30 | 7751 |
| 2000 | 150 | 45 | 6513 |
| 2000 | 150 | 60 | 6413 |
| 3000 | 100 | 30 | 7128 |
| 3000 | 100 | 45 | 7090 |
| 3000 | 100 | 60 | 7061 |
| 3000 | 150 | 30 | 7037 |
| 3000 | 150 | 45 | 7057 |
| 3000 | 150 | 60 | 7071 |
| 4000 | 100 | 30 | 5064 |
| 4000 | 100 | 45 | 5085 |
| 4000 | 100 | 60 | 5056 |
| 4000 | 150 | 30 | 5059 |
| 4000 | 150 | 45 | 5051 |
| 4000 | 150 | 60 | 5044 |
| 5000 | 100 | 30 | 4832 |
| 5000 | 100 | 45 | 4835 |
| 5000 | 100 | 60 | 4869 |
| 5000 | 150 | 30 | 4840 |
| 5000 | 150 | 45 | 4792 |
| 5000 | 150 | 60 | 4857 |

The wafers that were coated with a polyphenylquinoxaline antireflective layer at a spin speed of 3000 rpm were exposed to ultraviolet light having a wavelength of about 436 nm and their reflectivities were compared with the reflectivity of an aluminum coated wafer using a Beckman double beam spectrophotometer equipped with a reflectivity fixture. The results of those comparisons (based on the reflectivity of the aluminum coated wafer being 100%) are shown in Table II below:

TABLE II

| Bake Temperature (°C.) | Bake Time (min.) | Reflectivity (%) |
|---|---|---|
| 100 | 30 | 11 |
| 100 | 45 | 10 |
| 100 | 60 | 10 |
| 150 | 30 | 12 |
| 150 | 45 | 11 |
| 150 | 60 | 10 |

As can be seen from the above data, the ability of the polyphenylquinoxaline layers to absorb ultraviolet light is relatively constant as a function of the heat treatment conditions. We believe that this is a significant advantage of the polyphenylquinoxaline antireflective layers of the invention because it considerably broadens the conditions under which the antireflective layers can be processed in connection with the manufacture of semiconductor devices without adversely affecting the antireflective properties of those layers to a significant extent.

We claim:

1. A method of reducing reflections during the exposure of a photoresist layer in a semi-conductor device comprising:

(a) applying an antireflective layer comprising a polyphenylquinoxaline and having a thickness of less than about 1.0 micron to a semi-conductor device comprising a silicon wafer having at least one semiconductor element and a layer of a non-conductor on one of its surfaces;

(b) applying on top of the antireflective layer a photoresist layer comprising a material whose solubility characteristics in certain solvents is affected by exposure to ultraviolet radiation having a wavelength of from about 500 to about 350 nm, to obtain a semi-conductor device carrying an antireflective layer underneath a photoresist layer;

(c) selectively exposing a portion of the photoresist layer to ultraviolet light having a wavelength of from about 500 to about 350 nm, whereby at least a portion of the ultraviolet light passes through the photoresist layer into the antireflective layer and is absorbed by the antireflective layer;

(d) developing the photoresist layer to remove a portion of the photoresist layer from the semi-conductor device and to uncover a portion of the polyphenylquinoxaline layer underlying the photoresist layer;

(e) removing the portion of the polyphenylquinoxaline layer left uncovered in step (d) to uncover a portion of the layer underlying the polyphenylquinoxaline layer;

(f) removing the portion of the layer underlying the polyphenylquinoxaline layer left uncovered in step (e); and (g) removing the portion of the photoresist and polyphenylquinoxaline layers left remaining after step (f) above.

2. The method of claim 1 wherein the antireflective layer has a thickness of from about 0.1 to about 0.8 micron.

3. The method of claim 1 wherein the antireflective layer is applied on top of the layer of a non-conductor on one of the surfaces of the silicon wafer.

4. The method of claim 3 wherein the layer of a non-conductor comprises silicon dioxide.

5. The method of claim 1 in which the semi-conductor device further comprises an interconnection conductor layer and further wherein the antireflective layer is applied on top of the interconnection conductor layer.

6. The method of claim 5 wherein the interconnection conductor layer comprises a metal selected from the group consisting of aluminum, tungsten and titanium.

7. The method of claim 1 in which the semi-conductor device further comprises a passivating layer and further wherein the antireflective layer is applied on top of the passivating layer.

8. The method of claim 7 wherein the passivating layer comprises silicon dioxide.

9. The method of claim 1 wherein the polyphenylquinoxaline is the reaction product of (A) an aromatic tetraamine compound selected from the group consisting of

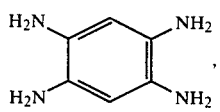

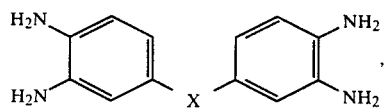

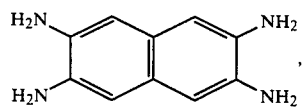

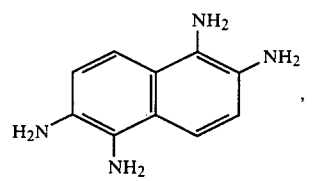

and mixtures thereof; and (B) a tetracarbonyl compound selected from the group consisting of

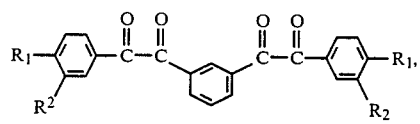

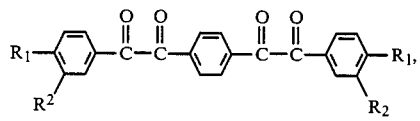

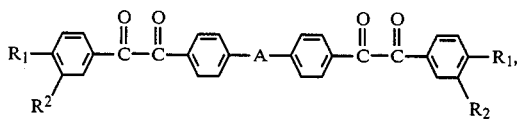

and mixtures thereof; wherein X and A are, independently, a direct bond, O,

S, SO, $SO_2$, $$\begin{array}{c} Y \\ | \\ B, Si, \\ | \; | \\ Z \; Y \end{array}$$

or $CH_2$;

and each Y and each Z is, independently, monovalent $C_1$ to $C_6$ alkyl or monovalent aryl; $R_1$ and $R_2$ are, independently, H or OH.

10. The method of claim 9 wherein the polyphenylquinoxaline is the reaction product of

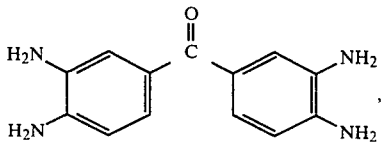

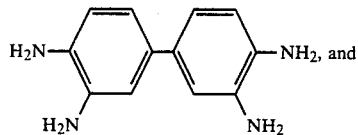

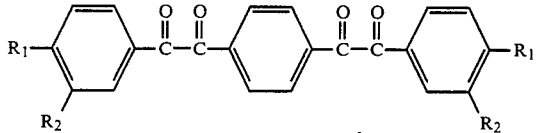

11. The method of claim 9 wherein the polyphenylquinoxaline is the reaction product of

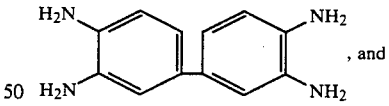

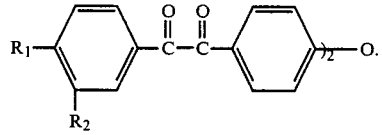

* * * * *